United States Patent [19]

Ishikawa et al.

[11] Patent Number: 4,675,710
[45] Date of Patent: Jun. 23, 1987

[54] LIGHT EMITTING SEMICONDUCTOR DEVICE

[75] Inventors: Hiroshi Ishikawa, Tokyo; Nobuyuki Takagi, Yokohama; Hajime Imai, Tokyo, all of Japan

[73] Assignee: Fujitsu Limited, Kawasaki, Japan

[21] Appl. No.: 361,543

[22] Filed: Mar. 24, 1982

[30] Foreign Application Priority Data

Mar. 31, 1981 [JP] Japan ................................ 56-47982

[51] Int. Cl.[4] .............................................. H01S 3/18
[52] U.S. Cl. ...................................... 357/17; 357/60; 372/46; 372/48
[58] Field of Search ............... 372/44, 46, 48; 357/17, 357/60

[56] References Cited

FOREIGN PATENT DOCUMENTS 52-3392  1/1977  Japan .
56-158496  12/1977  Japan .

OTHER PUBLICATIONS

Sov. Phys. Tech. Phys. 22, "Al-Ga-As Heterostructure with Confined Current Flow", by Alferov et al., Aug. 1977, pp. 1032-1036.

Electronics Letters, "High Temperature CW Operation of 1.5 μm InGaAsP/InP Buffer-Layer Loaded Plano-convex Waveguide Lasers", Noda et al., vol. 17, No. 6, Mar. 19, 1981, pp. 226-227.

RCA Review, "Chemical Etching of Silicon, Germanium, Gallium, Arsenide, and Gallium Phosphide", Kern, vol. 39, No. 2, Jun. 1978, pp. 278-308.

Electronics Letters, "Low Threshold Channelled-Substrate Buried Crescent InGaAsP Lasers Emitting at 1.54 μm", Devlin et al., vol. 17, No. 18, Sep. 3, 1981, pp. 651-653.

Electronics Letters, "V-Grooved Substrate Buried Heterostructure InGaAsP/InP Laser", Ishikawa et al., vol. 17, No. 13, Jun. 25, 1981, pp. 465-467.

Primary Examiner—James W. Davie
Attorney, Agent, or Firm—Staas & Halsey

[57] ABSTRACT

An InGaAsP/InP light emitting semiconductor device which includes an active layer buried in a groove. A (111) B facet of the InP crystal, which is an inclined side plane of the groove, is exposed. The side edges of the InGaAsP active layer reach to the (111) B facet.

9 Claims, 11 Drawing Figures

LIGHT EMITTING SEMICONDUCTOR DEVICE

BACKGROUND OF THE INVENTION

The present invention relates to a light emitting semiconductor device, such as a semiconductor laser having light wave guide built therein.

Recently, semiconductor devices have been developed which consists of a light wave guide formed by burying an active layer in a groove in a semiconductor substrate and enclosing the active layer within low-refractive indexed semiconductor materials, e.g., InP or an AlGaAs.

These semiconductor systems exhibit a zinc blend type crystal structure and expose conventionally a (111) A facet by etching a (100) plane of the crystal.

Zh. L. Alferov, et al., "AlGaAs Heterostructure with Confined Current Flow" in Sov. Phys. Tech. Phys. 22 (8) 1977, pp. 1032 1036 (August, 1977), recites that (111) A facets are exposed by etching the crystal with various etchants. However, Alferov, et al. does not teach to expose a (111) B facet.

W. Suzaki, et al. to Mitsubishi Denki K.K. (Mitsubishi Electric Corporation), "Japanese Patent Application Laid-Open No. 56-158496", discloses that an InGaAsP/InP laser is produced by furying an InGaAsp active layer in InP by a two-step liquid phase epitaxial technique and that a dovetail-shaped groove is etched along the <011> direction and a V-shaped groove is etched orthogonal to the dovetail groove, i.e., parallel to the <01$\bar{1}$> direction.

These grooves, either dovetail-shaped or V-shaped, have inclined side planes of a (111) A facet. The shapes and directions of these grooves are illustrated in FIG. 1. However, the grooves 1 and 2 having a (111) A facet have the following disadvantages. A dovetail-shaped groove 1 has a curved active layer expitaxially grown along the curvature of the bottom of the groove, which leads to unstable transverse mode oscillation. In addition, the side edges of the groove 1 tend to be etched off by melting. A V-shaped groove often suffers from poor epitaxial growth, because it is not always filled up by the grown layers.

The present inventors conducted experiments to determine the percentage of successfully grown InGaAsP active layers in the transverse section of InP V-shaped grooves having (111) A facets. The results are shown in Table 1, which shows the relationship between the percentage of successfully grown active layers, the cooling rate, and supercooling. As shown in the table, the yield is generally low. In addition, further defective portions remained in the longitudinal direction of the grooves. Therefore, it is impossible to use the resultant products as lasers.

TABLE 1

| | Percentage of Successful Growth | | | | |
| --- | --- | --- | --- | --- | --- |
| | | | | | (unit: %) |
| | Cooling rate (°C./min) | | | | |
| Supercooling (°C.) | 0.05 | 0.1 | 0.2 | 0.3 | 0.7 |
| 7 | — | 85 | 83 | 38 | 20 |
| 9 | — | 85 | — | — | — |
| 10 | 90 | 80 | 82 | 30 | — |
| 11 | 62 | 59 | 53 | — | — |
| 14 | 60 | 52 | — | 30 | 0 |

Robert D. Burnham, et al. to Xerox Corporation, "Japanese Patent Laid-Open No. 52-3392", discloses an AlGaAs/GaAs light emitting semiconductor device in which the AlGaAs active layer within a groove is connected to AlGaAs layers grown outside of the groove. The current which flows through the layers outside of the groove does not pass through the active layer. FIG. 5 shows the relationship between light output and current in InGaAsP/InP light emitting semiconductor devices obtained by our experiments. The upper width of the grooves were 3.6 μm and the measurement was performed at a temperature of 50° C. Curve A was obtained using a device in which the InGaAsP layer 15 in the groove 13 was separated from those outside of the groove 13, as shown in FIG. 2; curve B was obtained using a device in which the InGaAsP layer 15 continuously covers the n-InP layer 14, as shown in FIG. 4. The light output of curve B is relatively low in relation to the current. Thus, it is clear that the side edges of an active layer should not contact an InGaAsP layer outside of the groove.

SUMMARY OF THE INVENTION

It is a first object of the present invention to provide a light emitting semiconductor device having a stable transverse mode oscillation, with a smooth near field pattern.

It is a second object of the present invention to provide a light emitting semiconductor device in which the light output is high relative to the current.

It is a third object of the present invention to provide a light emitting semiconductor device in which the light output linearly increases in proportion with the increase of current.

It is a fourth object of the present invention to provide a light emitting semiconductor device which can be produced with a high yield.

Other objects and advantages of the present invention will be illustrated in the following description.

According to the present invention, there is provided a light emitting semiconductor device including an active layer buried in a groove formed in a semiconductor substrate, characterized in that the active layer includes InGaAsP and the substrate includes InP. A (111) B facet of an InP crystal forms an inclined side plane of the groove and the side edges of the active layer reach to the (111) B facet.

It is preferable that the transverse section of the groove have a V-shape. It is convenient that the transverse section of the groove have a five-sided U-shape. It is advantageous that the upper width of the groove be less than 4 μm.

It is advisable that the InP crystal, which has the inclined side plane of (111) B facet, be a p-InP layer grown on the n-InP substrate or a p-InP layer formed by a diffusion process on the n-InP substrate.

A light emitting semiconductor device according to the present invention is produced by etching a (100) plane of an InP crystal layer having a zinc blend type structure, so as to form a groove in the <011> direction. The inclined side plane of the groove is a (111) B facet of the InP crystal layer. The edges of the InGaAsP active layer can smoothly grow on the n-InP clad layer along the groove, so as to make a smooth near field pattern. In addition, the edges of the active layer do not contact the InGaAsP layer outside of the groove, so that the current passes entirely through the active layer and the emitting efficiency and linearity of light output to current are improved.

The groove may be either V-shaped of five-sided U-shaped. The etchant may be an Hcl—H₃PO₄ solution or an HCl—HNO₃ solution. The five-sided U-shaped groove has a ratio of HCl/HNO₃ less than 1:1. When the upper width of the groove is less than 4.0 μm, the active layer is grown into contact the inclined side plane of the groove so as to improve the emitting efficiency and linearity of light output to current. After the active layer grows on the n-InP clad layer in the groove, a p-InP clad layer and p-InGaAsP cap layer are sequentially epitaxially grown. Thus, the light emitting device is produced by a two-step liquid phase epitaxial technique. Fabrication by a one-step liquid phase epitaxial technique can also be successfully performed by employing a diffusion process for the formation of the P-InP layer. Fabrication by a one-step liquid phase epitaxial technique without a diffusion process is also possible. First, a groove is formed in an n-InP semiconductor substrate, then; an n-InP clad layer, an InGaAsP active layer, a p-type clad layer, and an InGaAsP cap layer are sequentially grown by a one-step liquid phase epitaxial technique. The restriction of current is effected by providing either an insulation layer, e.g., of silicon dioxide, having a stripe-shaped opening or a stripe-shaped p-type impurity diffusion region opened in the n-type cap layer. However, such a light emitting device is rather disadvantageous in that some of the current passes out of the groove, which leads to a lower intensity of the laser beam.

DESCRIPTION OF THE PREFERRED EMBODIMENTS

Figure 1:
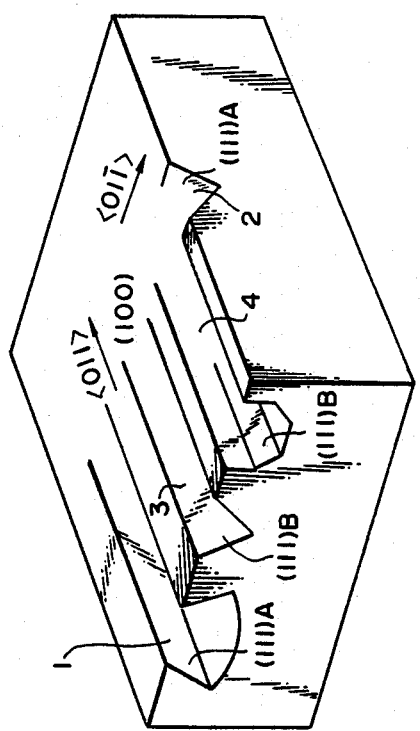
FIG. 1 is a perspective view of a substrate having grooves 3 and 4 according to the present invention and grooves 1 and 2 according to the prior art.

An InGaAsP/InP double heterojunction laser, which has a stripe-shaped groove 3 or 4 along the <011> direction of an n-InP substrate as shown in FIG. 1, was produced as an embodiment of the present invention.

Figure 2:
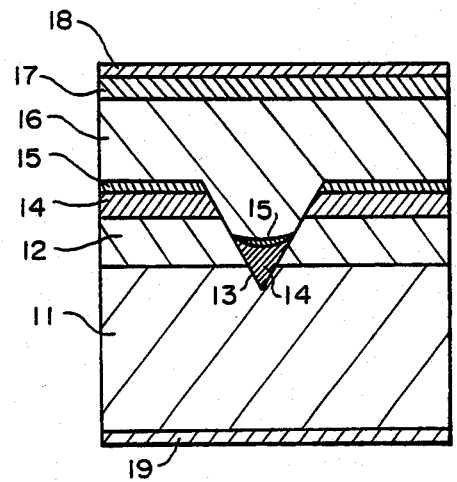
FIG. 2 is a transverse section of a first embodiment of a light emitting semiconductor device according to the present invention.
Figure 3:
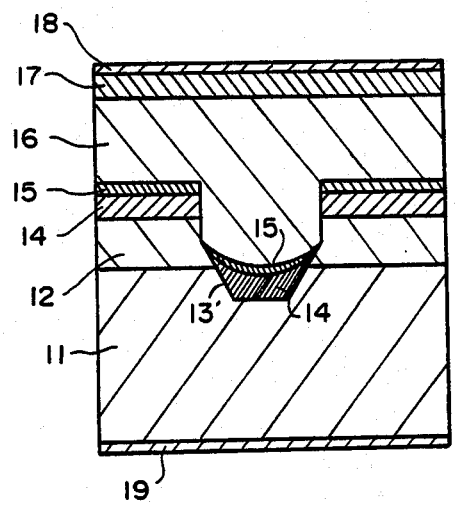
FIG. 3 is a transverse section of a second embodiment of a light emitting semiconductor device according to the present invention.
Figure 4:
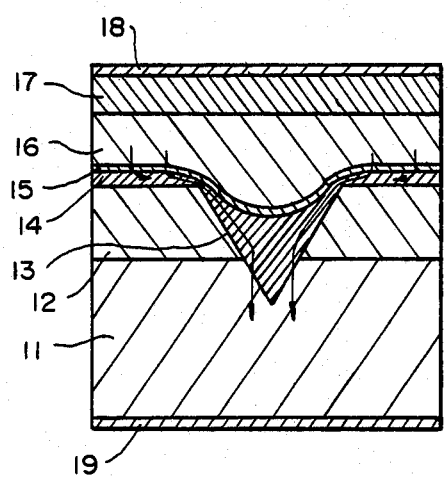
FIG. 4 is a transverse section of a light emitting semiconductor device, in which the active layer covers the n-InP layer.
Figure 5:
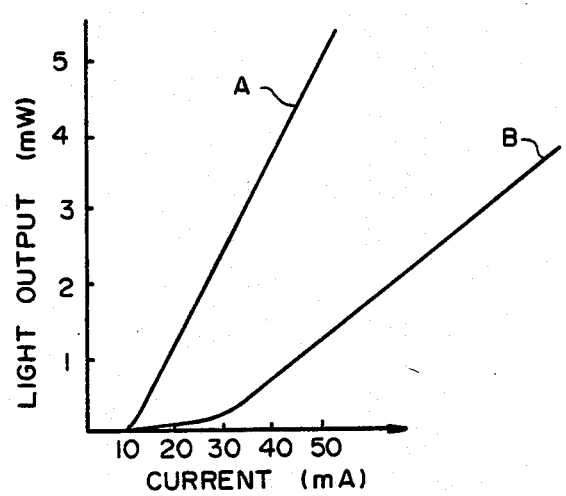
FIG. 5 is a graph of the relationship between light output and current at a temperature of 50° C. according to the present invention (A) and the prior art (B)

Referring to FIG. 2, a p-InP current restriction layer 12 with a thickness of approximately 1.5 μm was formed on a (100) plane of an n-InP substrate 11 by liquid phase epitaxial growth or impurity diffusion. A stripe-shaped groove 13 was formed along the <011> direction of the n-InP substrate 11 by means of photolithography and chemical etching through the p-InP current restriction layer 12 down into the n-InP substrate 11. The etching was carried out using an HCl—H₃PO₄ solution or an HCl—HNO₃ solution as the etchant. These etchants exposed a mirror surface (111) B facet of the p-InP current restriction layer 12 as the inclined side plane of the two types of grooves. Both etchants form V-shaped grooves indicated as 3 in FIG. 1 or 13 in FIG. 2. When the ratio of HCl to HNO₃ was less than 1:1, a five-sided U-shaped groove was formed, indicated as 4 in FIG. 1 or 13' in FIG. 3.

Then, an n-InP clad layer 14, a non-doped InGaAsP active layer 15, a p-InP clad layer 16, and a p-InGaAsP cap layer 17 were sequentially grown by liquid phase epitaxial growth. The thickness of these layers 14, 15, 16 and 17 were, for example 0.3 to 0.8, approximately 0.2, ca. 1.5, and approximately 0.5 μm, respectively. Thereafter, a p-side electrode 18 and an n-side elecrode were produced as usual.

Table 2 shows the percentage of active layers 15 successfully grown at various cooling rates and various supercoolings on the V-shaped groove 13, the inclined side plane which was the (111) B facet of the p-InP current restriction layer 12. The yield was 100%. In addition, as the active layers 15 began to grow from the narrow bottom of the n-InP clad layer 14, the curvature of the transverse section of the active layers 15 was relatively small. The active layer 15 grown in the five-sided U-shaped groove 13' also exhibits acceptable performance.

TABLE 2

| Supercooling (°C.) | Percentage of Successful Growth Cooling rate (°C./min) | | | | (unit: %) |
|---|---|---|---|---|---|
|  | 0.05 | 0.1 | 0.2 | 0.3 | 0.7 |
| 7 | — | 100 | 100 | 100 | 100 |
| 9 | — | 100 | — | — | — |
| 10 | 100 | 100 | 100 | 100 | — |
| 11 | 100 | 100 | 100 | — | — |
| 14 | 100 | 100 | — | 100 | 100 |

Figure 6:
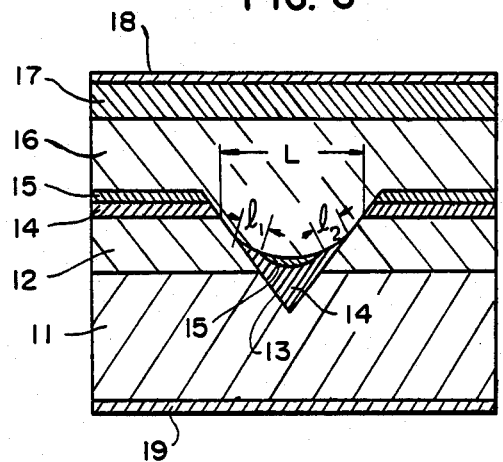
FIG. 6 is an enlarged transverse section of an active layer of the present invention.

In order to obtain the optimum relationship between light output and current, the following experiments were carried out. As seen from FIG. 6, $l_1$ and $l_2$ correspond to the length of transverse sections of the n-InP clad layer 14 which are not covered with the active layer 15, and L corresponds to the upper width of the groove 13.

Figure 7:
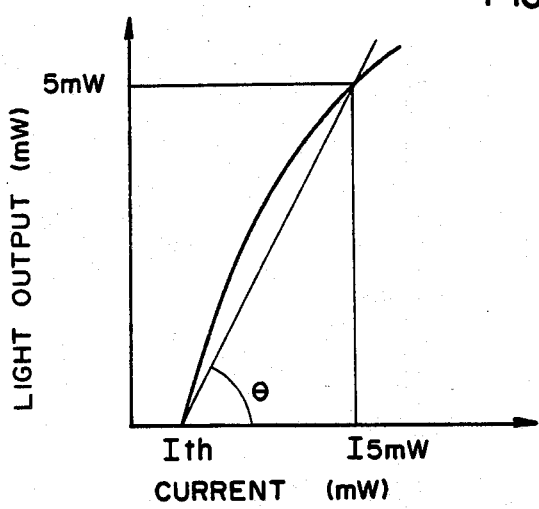
FIG. 7 is a graph of the relationship between light output, current and the angle θ obtained from a light emitting semiconductor device of the present invention.
Figure 8:
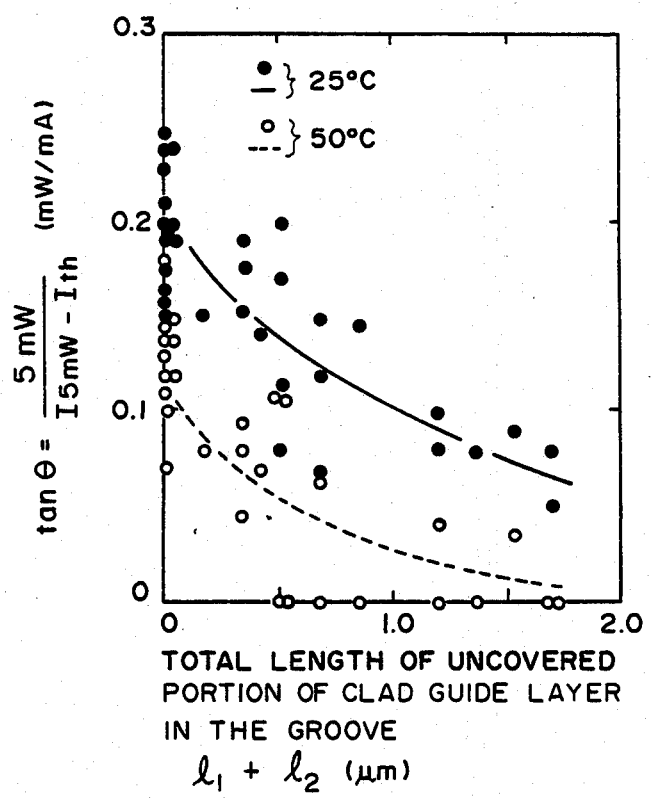
FIG. 8 is a graph of the relationship between the tangent of the angle θ and the total length of the uncovered portion of the clad guide layer in the groove of the present invention.

FIG. 7 is a graph of the relationship between light output and current of a light emitting semiconductor device having an InGaAsP active layer buried in the groove. As the current increases, light begins to emit at a threshold current $I_{th}$ and gradually increases. Conveniently, a point was set for light output of 5 mW, then, the relationship between 5 mW/($I_5\ _{mW}-I_{th}$) and the total length of $l_1$ and $l_2$ was plotted as shown in FIG. 8. The plotted dots and o were obtained at 25° C. and 50° C., respectively. The solid line and the broken line were obtained referring to the dots and o, respectively. The term 5 mW/$I_5\ _{mW}-I_{th}$) corresponds to the tangent of the angle $\theta$ as shown in FIG. 7.

As seen from FIG. 8, when the total length of $l_1$ and $l_2$ is zero, i.e., the side edges of the active layer 15 reach the (111) B facet of the p-InP clad layer, the tangent of the angle $\theta$ is maximum.

Figure 9:
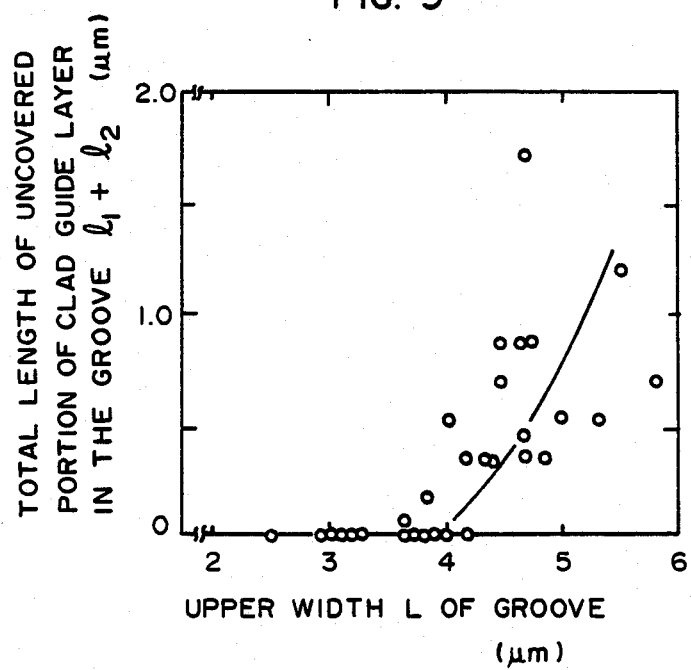
FIG. 9 is a graph of the relationship between the total length of the uncovered portion of the clad guide layer in the groove and the upper width L of the groove in the present invention.

FIG. 9 is a graph of the relationship between the total length of $l_1+l_2$ and the upper width L of the groove. When the width L is less than 4 μm, the total length of $l_1+l_2$ decreases to zero. Thus, when the upper width L of the groove 13 is less than 4 μm it is concluded that the side edges of the active layer 15 completely cover the (111) B facet of the p-InP clad layer.

Figure 10A:
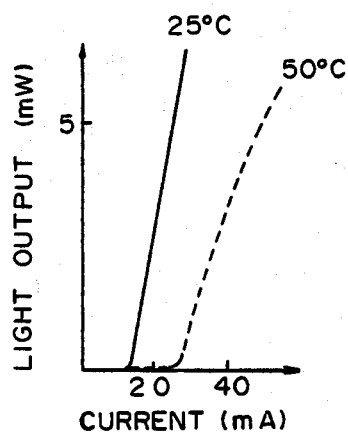
FIG. 10A is a graph of the relationship between light output and current obtained from a light emitting semiconductor device having an upper width L less than 4.0 μm.
Figure 10B:
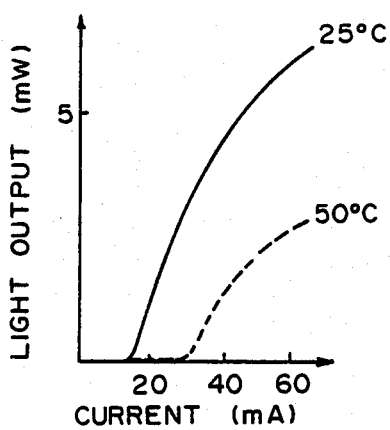
FIG. 10B is a graph similar to FIG. 10A obtained from a light emitting device having an upper width L of more than 4.0 μm.

FIGS. 10A and 10B, similar to FIG. 7, are graphs of the relationship between light output and current of a light emitting semiconductor device, obtained at 25° C. and 50° C. The upper width L of the grooves of the devices used in the experiments of FIGS. 10A and 10B were 3.6 μm and 4.7 μm, respectively.

FIG. 10A shows that light output increases linearly in proportion with the increase of the current in the case where the side edges of the active layer contact the (111) B facet of the current restriction layer 12. On the other hand, FIG. 10B shows that light output does not increase linearly in proportion with the current in the case where the side edges of the active layer 15 do not contact the (111) B facet of the p-InP current restriction layer 12, i.e., the total length of the uncovered portion of the n-InP clad guide 14 is, e.g., 0.6 μm.

The many features and advantages of the invention are apparent from the detailed specification and thus, it is intended by the appended claims to cover all such features and advantages of the device which fall within the true spirit and scope of the invention. Further, since numerous modifications and changes will readily occur to those skilled in the art, it is not desired to limit the invention to the exact contruction and operation shown and described, and accordingly, all suitable modifications and equivalents may be restored to as falling within the scope of the invention.

We claim:

1. A light emitting semiconductor device comprising:
   a semiconductor substrate having a groove formed therein;
   an active layer formed in said groove in said semiconductor substrate, said active layer comprising InGaAsP and said semiconductor substrate comprising an InP crystal, said InP crystal having a (111) B facet forming an inclined side plane of said groove, the side edges of said active layer extending to said (111) B facet.

2. A light emitting semiconductor device according to claim 1, wherein a transverse section of said groove has a V-shape.

3. A light emitting semiconductor device according to claim 1, wherein a transverse section of said groove has a five-sided U-shape.

4. A light emitting semiconductor device according to claim 2, wherein an upper width of the opening of said groove is less than 4 μm.

5. A light emitting semiconductor device according to claim 1, 2 or 3, wherein said semiconductor substrate further comprises an n-type InP layer and wherein said InP crystal is a p-type InP layer formed on said n-type InP layer.

6. A light emitting semiconductor device having a substrate of InP, comprising:
   a current restriction layer formed on the substrate, having a stripe-shaped groove formed therein, said stripe-shaped groove reaching into the substrate and having inclined side planes of a (111) B facet of the InP;
   a clad layer having a first portion formed on said current restriction layer and having a second portion formed in said stripe-shaped groove; and
   an active layer of InGaAsP having a first portion formed on said first portion of said clad layer and a second portion formed on said second portion of said clad layer.

7. A light emitting semiconductor device according to claim 6, wherein said stripe-shaped groove has a V-shape.

8. A light emitting semiconductor device according to claim 6, wherein said stripe-shaped groove has a five sided U-shape.

9. A light emitting semiconductor device according to claim 6, wherein said current restriction layer comprises p-type InP.

* * * * *

UNITED STATES PATENT AND TRADEMARK OFFICE
CERTIFICATE OF CORRECTION

PATENT NO.  : 4,675,710
DATED       : JUNE 23, 1987
INVENTOR(S) : HIROSHI ISHIKAWA ET AL.

It is certified that error appears in the above-identified patent and that said Letters Patent is hereby corrected as shown below:

Col. 3, line 20, "then;" should be --then--.

Col. 4, line 31, "ca." should be --approximately--;
        line 58, "$l_1$ and $l_2$" should be --$\ell_1$ and $\ell_2$--.

Col. 5, line 2, "$l_1$ and $l_2$" should be --$\ell_1$ and $\ell_2$--;

line 3, "dots" should be --dots •--;
        line 5, "dots" should be --dots •--;
        line 8, "$l_1$" should be --$\ell_1$--;

line 9, "$l_2$" should be --$\ell_2$--;

line 13, "$l_1+l_2$" should be --$\ell_1+\ell_2$--;

line 15, "$l_1+l_2$" should be --$\ell_1+\ell_2$--.

Signed and Sealed this

Tenth Day of November, 1987

Attest:

DONALD J. QUIGG

Attesting Officer

Commissioner of Patents and Trademarks